United States Patent
Bhatt et al.

(10) Patent No.: US 6,482,075 B1
(45) Date of Patent: Nov. 19, 2002

(54) PROCESS FOR PLANARIZING AN ISOLATION STRUCTURE IN A SUBSTRATE

(75) Inventors: Hemanshu D. Bhatt, Troutdale, OR (US); Shafqat Ahmed, Beaverton, OR (US); Robindranath Banerjee, Gresham, OR (US); Charles E. May, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 53 days.

(21) Appl. No.: 09/670,998

(22) Filed: Sep. 27, 2000

(51) Int. Cl.[7] .................................................. B24B 1/00
(52) U.S. Cl. .............................. 451/29; 451/30; 451/41; 451/54
(58) Field of Search ............................. 451/29, 30, 31, 451/42, 54; 216/88, 89; 438/692, 693

(56) References Cited

U.S. PATENT DOCUMENTS

| | | | |
|---|---|---|---|
| 4,571,819 A | * 2/1986 | Rogers et al. | 257/397 |
| 4,576,834 A | * 3/1986 | Sobczak | 216/17 |
| 4,630,356 A | * 12/1986 | Christie et al. | 438/444 |
| 6,057,580 A | * 5/2000 | Watanabe et al. | 257/396 |
| 6,140,691 A | * 10/2000 | Gardner et al. | 257/396 |

* cited by examiner

*Primary Examiner*—Timothy V. Eley
(74) *Attorney, Agent, or Firm*—Luedeka, Neely & Graham, P.C.

(57) ABSTRACT

A process is described for planarizing an isolation structure in a substrate. The process includes depositing a pad protective material over an upper surface of the substrate, and selectively removing portions of the pad protective material to expose portions of the substrate and to form sidewalls in the pad protective material. A trench is formed in the exposed portions of the substrate, and a trench fill material is deposited in the trench and over the pad protective material. A trench protective material is deposited over the trench fill material and in contact with the sidewalls of the pad protective material, such that the pad protective material and portions of the trench protective material together form a continuous protective material layer. Portions of the trench protective material and the trench fill material are selectively removed down to the level of the upper surface of the pad protective material. Finally, the pad protective material and any remaining trench protective material is removed, leaving the trench filled with trench fill material that is planarized at the upper surface of the substrate. By forming a continuous protective material layer that completely covers the trench fill material in the trench, that material is protected during later process steps that nonselectively remove trench fill material lying outside the trench. In this manner, the trench fill material lying outside the trench may be removed without photolithographic masking and patterning steps. Thus, the process according to the invention reduces the cost and complexity of planarizing the trench fill material.

20 Claims, 4 Drawing Sheets

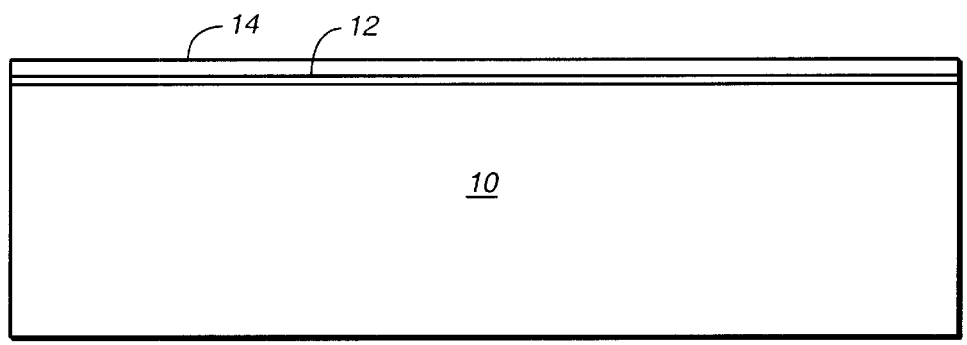
FIG._1
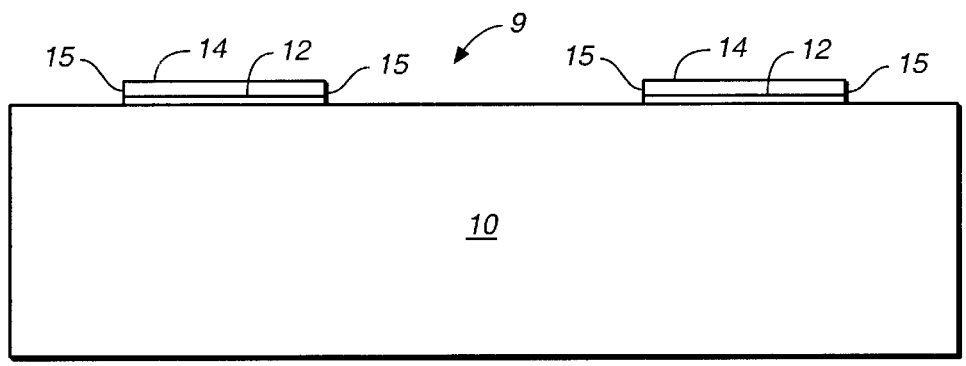
FIG._2
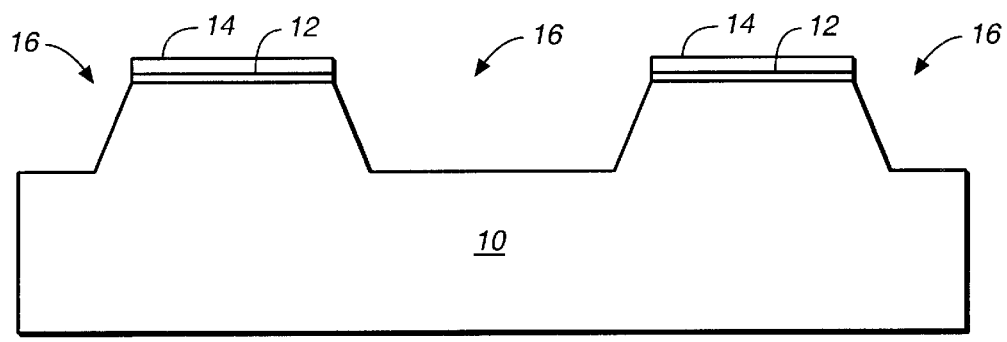
FIG._3

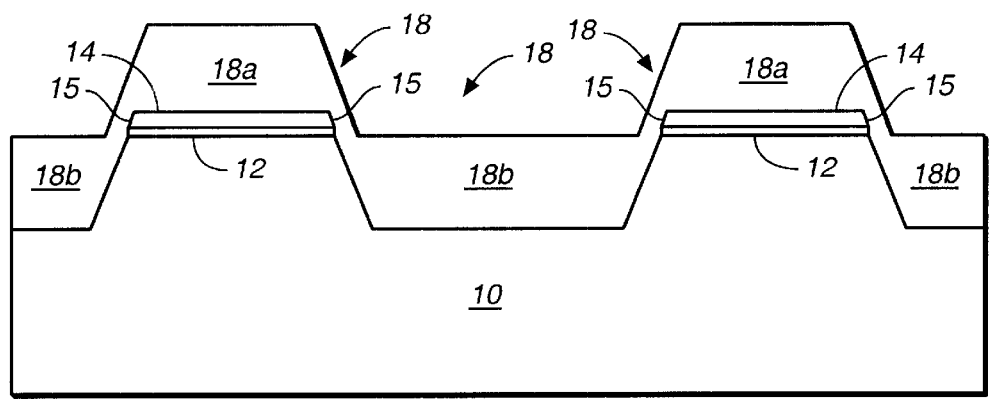
FIG._4
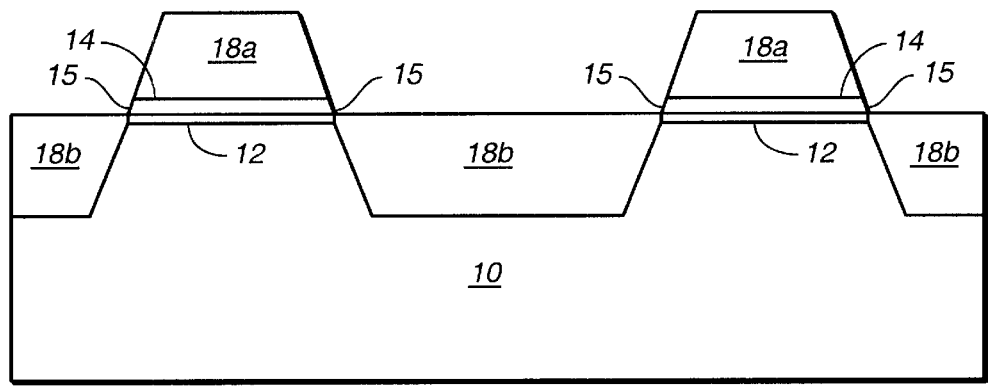
FIG._5
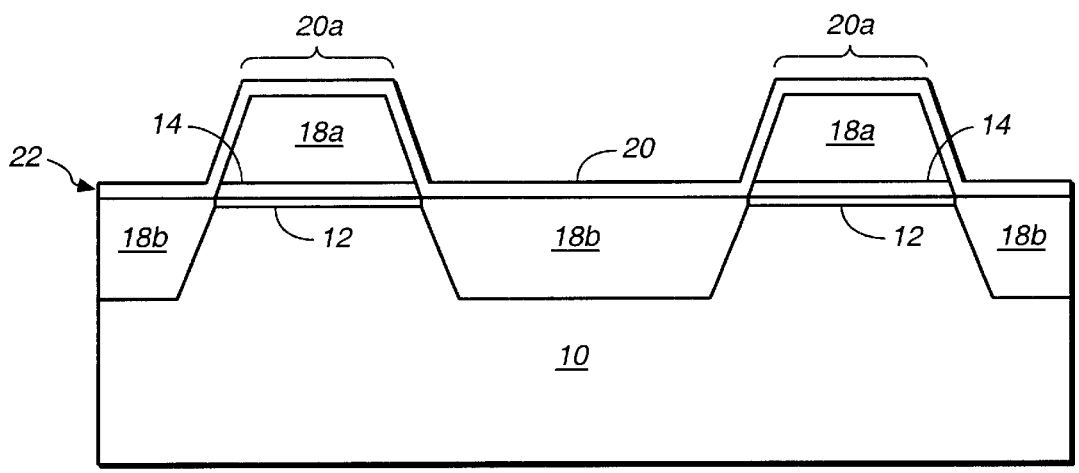
FIG._6

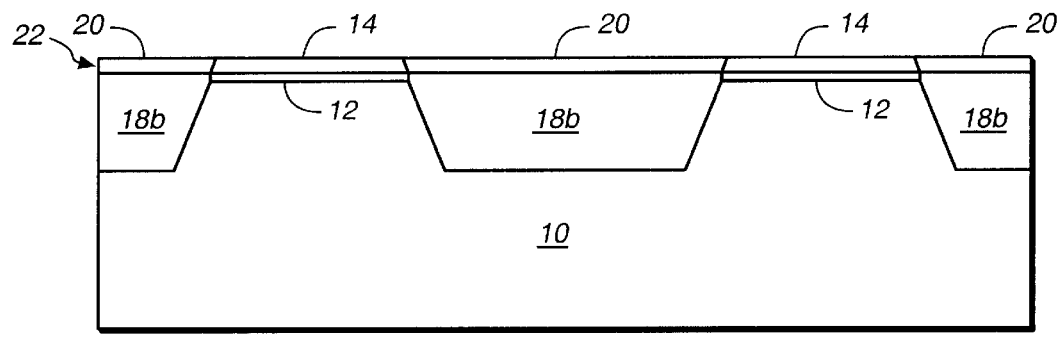
FIG._7
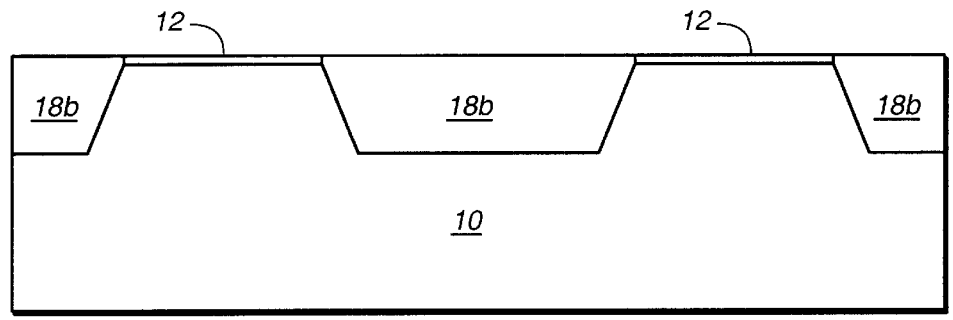
FIG._8
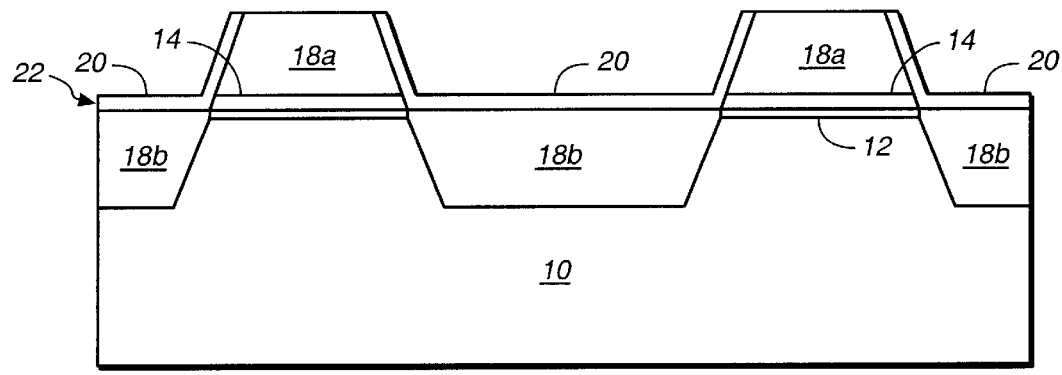
FIG._9

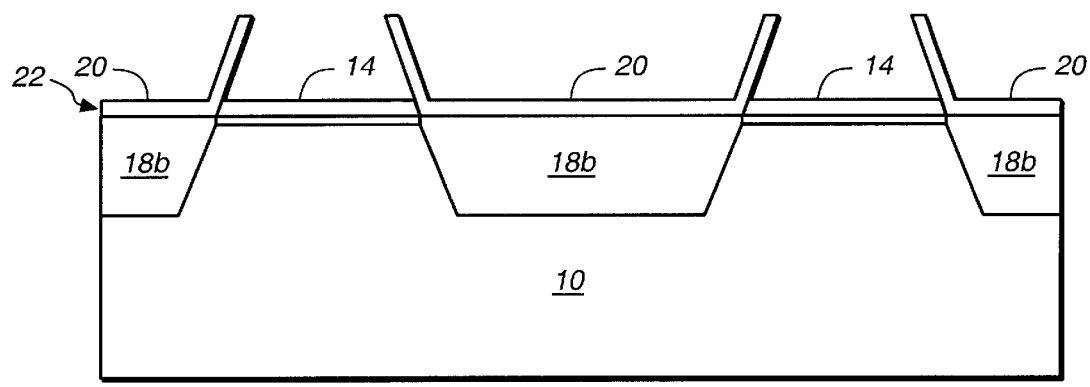
FIG._10

PROCESS FOR PLANARIZING AN ISOLATION STRUCTURE IN A SUBSTRATE

FIELD

This invention relates to the processing of monolithic integrated circuits. More particularly, the invention relates to forming isolation structures in a substrate of a monolithic integrated circuit.

BACKGROUND

Many monolithic integrated circuits contain millions of active devices, such as complementary metal-oxide semiconductor devices, formed in a semiconductor substrate. Typically, regions of nonconductive material, such as silicon oxide, physically separate these active devices in the substrate and provide electrical isolation between neighboring P- or N-doped regions of the active devices. These regions of nonconductive material are often referred to as isolation structures. One type of isolation structure is a shallow trench isolation structure. Methods of forming such structures are generally referred to as shallow trench isolation processing.

Past shallow trench isolation processing methods have generally included depositing an oxide material that covers the substrate, such as by Thick Trench Fill Oxide deposition. This oxide deposition step fills previously-formed isolation trenches in the substrate as well as depositing oxide on the substrate surfaces that lie between the trenches. To accommodate further processing of the active device structures, the excess oxide material is typically removed from the substrate surfaces that lie between the trenches. In prior shallow trench isolation processing methods, removing the excess oxide involves reverse masking and etching, followed by chemical mechanical polishing to planarize the remaining oxide material at the surface of the substrate.

A significant disadvantage of the prior methods is the necessity of the reverse mask and etching steps to remove the oxide between the trenches. Each photolithography processing step adds significant cost, processing time, and complexity to the fabrication process. For example, photolithography processing typically requires generation of a mask indicating the geometric pattern of the areas of excess oxide to be removed, application and curing of photoresist, exposure of the photoresist using the mask, and development of the photoresist after exposure. Not only are each of these steps time consuming and expensive to perform, but each step introduces a quality control concern. Thus, quality control inspection steps are typically included which add more cost and time to the process. Thus, masking and patterning steps are to be avoided whenever possible.

What is needed, therefore, is a process for forming isolation structures in a monolithic integrated circuit that eliminates the photolithography step required to reverse mask and etch the oxide between the isolation structures, and the costs attendant with such photolithography steps.

SUMMARY

The above and other needs are met by an improved process for planarizing an isolation structure in a substrate. The improved process includes depositing a pad protective material over the upper surface of the substrate, and selectively removing portions of the pad protective material to expose portions of the substrate and to form sidewalls in the pad protective material. A trench is formed in the exposed portions of the substrate, and a trench fill material is deposited in the trench and over the pad protective material. A trench protective material is deposited over the trench fill material and in contact with the sidewalls of the pad protective material, such that the pad protective material and portions of the trench protective material together form a continuous protective material layer. Portions of the trench protective material and the trench fill material are selectively removed down to the level of the upper surface of the pad protective material. Finally, the pad protective material and any remaining trench protective material is removed, leaving the trench filled with trench fill material that is planarized at the upper surface of the substrate.

By forming a continuous protective material layer that completely covers the trench fill material in the trench, the trench fill material in the trench is protected during later process steps that nonselectively remove trench fill material lying outside the trench. In this manner, the trench fill material lying outside the trench may be removed without photolithographic masking and patterning steps. Thus, the process according to the invention reduces the cost and complexity of planarizing the trench fill material.

In one preferred embodiment of the invention, the continuous protective layer is a nitride layer that acts as a polish stop during a chemical mechanical polishing step for removing the unwanted oxide trench fill material.

In another preferred embodiment, the continuous protective layer is a nitride layer that acts as an etch stop during an etching step for removing the unwanted oxide trench fill material.

In some preferred embodiments, depositing the pad protective material includes depositing a first nitride layer over the substrate upper surface. Portions of this first nitride layer are selectively removed to expose portions of the substrate and to form sidewalls in the first nitride layer. Depositing the trench protective material preferably includes depositing a second nitride layer over the trench fill material and in contact with the sidewalls of the first nitride layer, such that the first nitride layer and portions of the second nitride layer covering the trench together form a continuous nitride layer.

In yet another preferred embodiment, the improved process includes depositing a pad protective material over the upper surface of the substrate, and selectively removing portions of the pad protective material to expose portions of the substrate and to form sidewalls in the pad protective material. A trench is formed in the exposed portions of the substrate, and a trench fill material is deposited in the trench and over the pad protective material. A trench protective material is deposited over the trench fill material and in contact with the sidewalls of the pad protective material, such that the pad protective material and portions of the trench protective material together form a continuous protective material layer. Portions of the trench protective material are selectively removed to expose portions of the trench fill material that overly the pad protective material, and the exposed portions of the trench fill material are selectively removed down to the level of the upper surface of the pad protective material. Finally, remaining portions of the pad protective material and trench protective material are removed, leaving the trench filled with trench fill material that is planarized at the upper surface of the substrate.

In another aspect, the invention provides a monolithic circuit manufactured according to a process as described above.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 1 is a cross-sectional view of a monolithic circuit after deposition of a pad oxide layer and a first nitride layer on a substrate according to a preferred embodiment of the present invention;

FIG. 2 is a cross-sectional view of the monolithic circuit after patterning of the pad oxide and nitride layers according to a preferred embodiment of the invention;

FIG. 3 is a cross-sectional view of the monolithic circuit after formation of trenches in the substrate according to a preferred embodiment of the invention;

FIG. 4 is a cross-sectional view of the monolithic circuit after deposition of a trench fill oxide layer according to a preferred embodiment of the invention;

FIG. 5 is a cross-sectional view of the monolithic circuit after exposing sidewalls in the first nitride layer according to a preferred embodiment of the invention;

FIG. 6 is a cross-sectional view of the monolithic circuit after deposition of a second nitride layer according to a preferred embodiment of the invention;

FIG. 7 is a cross-sectional view of the monolithic circuit after removal of portions of the trench fill oxide material and portions of the second nitride layer according to a preferred embodiment of the present invention;

FIG. 8 is a cross-sectional view of the monolithic circuit after removal of remaining portions of the first and second nitride layers according to a preferred embodiment of the present invention;

FIG. 9 is a cross-sectional view of the monolithic circuit after removal of portions of the second nitride layer according to an alternate embodiment of the present invention; and FIG. 10 is a cross-sectional view of the monolithic circuit after removal of portions of the trench fill oxide material according to an alternate embodiment of the present invention.

DETAILED DESCRIPTION

Referring now to FIG. 1, there is depicted a cross sectional view of a portion of a silicon substrate 10 to be used for the formation of the various semiconductor devices in a monolithic integrated circuit. Although the method of the invention described herein is applied to the silicon substrate 10, it is appreciated that substrates of other semiconducting materials are also acceptable. For example, substrates of germanium or gallium arsenide may also be used, with appropriate consideration given and selections made within the constraints as described below as to the other elements of the monolithic circuits that are formed.

Further, although the process described herein is particularly well suited for forming isolation structures between complementary metal-oxide semiconductor devices, the process is also applicable to forming and planarizing other types of structures in other types of monolithic circuit devices. Also, the oxide planarization process described herein is applicable to planarizing other types of oxide structures, though it is specifically applied to shallow trench isolation structures in the following description.

As shown in FIG. 1, a pad oxide layer 12 is deposited over and in contact with the either the entire surface of the substrate 10 or over the relevant portions of the surface of the substrate 10. In the preferred embodiment, the pad oxide layer 12 is silicon oxide. The pad oxide layer 12 may be formed according to one or more of a number of different methods, such as thermal oxidation or chemical vapor deposition. Preferably, the pad oxide layer 12 is between about 50 angstroms thick and about 300 angstroms thick, and is most preferably about 100 angstroms thick.

With continued reference to FIG. 1, a first nitride layer 14 is deposited over and in contact with the pad oxide layer 12. The first nitride layer 14 is also referred to herein as a pad protective material layer 14, which more particularly indicates its eventual intended function, as described more fully below. In the preferred embodiment, the first nitride layer 14 is silicon nitride. The first nitride layer 14 may be formed according to one or more of a number of different methods, such as furnace chemical vapor deposition or plasma enhanced chemical vapor deposition. Preferably, the first nitride layer 14 is between about 800 angstroms thick and about 2,000 angstroms thick, and is most preferably about 1,500 angstroms thick.

As depicted in FIG. 2, portions of the pad oxide layer 12 and the first nitride layer 14 directly overlying an isolation region 9 of the substrate 10 are removed to expose the upper surface of the substrate 10. This is accomplished according to one or more of a number of different methods, such as by masking with photoresist the portions of the first nitride layer 14 that are not to be removed, patterning the photoresist mask, and wet or dry etching the first nitride layer 14 and the pad oxide layer 12 down to the upper surface of the substrate 10. When the first nitride layer 14 is etched through, sidewalls 15 are formed in the nitride layer 14, as depicted in FIG. 2.

With reference to FIG. 3, trenches 16 are formed in the substrate 10 in the previously-exposed isolation regions. The trenches 16 are formed according to one or more of a number of different methods, such as by preferably wet etching the silicon substrate 10. This trench formation step may be a continuation of the etching of the pad oxide layer 12 and the first nitride layer 14, as described above. Alternately, trenches 16 may be formed by dry etching. Preferably, the trenches 16 are between about 2,000 angstroms deep and about 6,000 angstroms deep, and are most preferably about 3,500 angstroms deep. Thus, FIG. 3 depicts the isolation trenches 16 formed at the completion of the representative steps described above.

As depicted in FIG. 4, a trench fill material layer 18 is deposited over either the entire surface of the monolithic circuit structure or over the relevant portions of the monolithic circuit structure. In the preferred embodiment, the trench fill material layer 18 is silicon oxide. The trench fill material layer 18 may be formed according to one or more of a number of different methods, such as high-density plasma deposition or different forms of chemical vapor deposition, such as but not limited to atmospheric pressure chemical vapor deposition or plasma enhanced chemical vapor deposition. Preferably, the trench fill material layer 18 is between about 3,000 angstroms thick and about 9,000 angstroms thick, and is most preferably about 6,000 angstroms thick, so that the trenches 16 are completely filled.

The process of depositing the trench fill material layer 18 tends to completely cover the circuit structure, thereby forming portions 18a of the trench fill material layer 18 that cover the active device areas between the trenches 16, and portions 18b of the trench fill material layer 18 that fill the trenches 16. In the finished circuit described herein, however, only the portions 18b of the trench fill material layer 18 are desired. Thus, the portions 18a are preferably removed. As described in more detail below, one of the advantages of the present invention is the novel process for removing the portions 18a of the trench fill material layer 18 in a manner that does not require a photolithography masking step.

As FIG. 4 indicates, since the trench fill material layer 18 is in one embodiment deposited as a continuous film, the sidewalls 15 of the first nitride layer 14 are covered by the trench fill material layer 18. In order to accommodate later processing steps described below, it is desirable to expose the sidewalls 15 of the first nitride layer 14 by removing a portion of the overlying trench fill material layer 18. The sidewalls 15 may be exposed according to one or more of a number of different methods, generally referred to herein as sidewall profile modification. In this embodiment of the invention, the sidewalls 15 of the first nitride layer 14 are preferably exposed by a highly directional sputter etch or other etch process that preferentially removes the trench fill material layer 18 from the sidewalls of the structures 18a that reside over the active areas of the substrate.

However, in a more preferred embodiment of the invention, the trench fill material layer 18 is deposited using a high density plasma deposition process having both a deposition component and an etch component. The deposition component and the etch component are balanced such that there is a modification of the sidewalls of the deposited material during the deposition itself. In other words, as the trench fill material layer 18 is deposited, the corners and sidewalls of the trench fill material layer 18 are simultaneously etched back, which directly produces the cross sectional profile as depicted in FIG. 5, without ever forming the intermediate cross sectional profile as depicted in FIG. 4. With reference to FIG. 6, a second nitride layer 20 is deposited over and in contact with the trench fill material layer portions 18a and 18b and the exposed sidewalls 15 of the first nitride layer 14. The second nitride layer 20 is also referred to herein as a trench protective material layer 20, which more particularly indicates its eventual intended function, as described more fully below. The second nitride layer 20 may be formed according to one or more of a number of different methods, such as thermal chemical vapor deposition, high density plasma chemical vapor deposition, or plasma enhanced chemical vapor deposition. Preferably, the second nitride layer 20 is between about 500 angstroms thick and about 3,000 angstroms thick, and is most preferably about 1,500 angstroms thick. Although the second nitride layer 20 is preferably formed from the same material as the first nitride layer 14, it will be appreciated that the second nitride layer 20 may be a different material, such as a different nitride compound. However, it is preferable that the material for both the first and the second nitride layers 14 and 20 be so selected that the two layers 14 and 20 may be stripped simultaneously in a later step by the same etchant.

As shown in FIG. 6, the connecting portions of the first and second nitride layers 14 and 20 preferably form a continuous nitride layer 22, also referred to herein as a continuous protective layer 22. As this name indicates, the continuous protective layer 22 provides a continuous boundary that protects the underlying substrate 10 and the portions 18b of the trench fill material layer 18 from mechanical and chemical planarization and etch processes described below.

Planarization of the structure depicted in FIG. 6 may be accomplished in a number of different ways, two of which are described hereinafter. According to one embodiment, portions 20a of the second nitride layer 20 and the portions 18a of the trench fill material layer 18 are removed by chemical mechanical polishing down to the level of the top surface of the first nitride layer 14. During the chemical mechanical polishing process, the portions 18a of the trench fill material layer 18, which are preferably significantly softer than the nitride layer 22, polish away at a significantly faster rate than does the nitride layer 22. Thus, when the chemical mechanical polishing process reaches down to the nitride layer 22, the nitride material is removed relatively slowly compared to the oxide, thereby providing a significant window of time during which the chemical mechanical polishing process may be stopped before the process completely removes the nitride layer 22. Therefore, in this embodiment, the continuous nitride layer 22 functions as a polish-stop, making the duration of the chemical mechanical polishing process much less time-critical. After completion of the chemical mechanical polishing process, the structure appears as shown in FIG. 7.

As depicted in FIG. 8, the continuous nitride layer 22 is preferably completely removed to expose the pad oxide layer 12 and the portions 18b of the trench fill oxide material 18 in the isolation trenches 16. This is accomplished according to one or more of a number of different stripping methods, such as by wet or dry etching. FIG. 8 depicts the structure as it appears after the continuous nitride layer 22 has been stripped.

In comparison to prior shallow trench isolation chemical mechanical polishing processes, the process described above significantly reduces nonuniformity in the thickness of the portions of the trench oxide material 18b remaining in the trenches 16. Uniformity in the thickness of the trench oxide material 18b provides for more uniform circuit structures formed in later processing steps. In addition to the improved surface morphology, the invention eliminates several process steps that were required in previous techniques, including reverse masking of the trench oxide material portions 18a.

According to a second general embodiment of the invention, the portions 20a of the second nitride layer 20 disposed directly above the first nitride layer 14, as shown in FIG. 6, are removed by a timed chemical mechanical polishing process. Preferably, this timed chemical mechanical polishing process extends down into the trench fill oxide material layer 18, such as into the top portions 18a of the trench fill oxide material layer 18. Although the actual level at which this polishing step stops is not particularly critical, it is preferable that the portions 20a of the second nitride layer 20 are completely removed, so that the underlying portions 18a of the trench fill oxide material layer 18 are exposed. FIG. 9 depicts the structure as it appears after completion of the timed chemical mechanical polishing process, when the remaining upper portions 18a of the trench fill oxide material layer 18 are exposed in those areas where the second nitride layer 20 has been removed by the chemical mechanical polishing.

After exposing them, the portions 18a of the trench fill oxide material layer 18 are completely removed, preferably by a hydrofluoric acid dip. Alternately, the portions 18a are removed by any one of a number of different stripping methods, such as by wet etching with another solution specifically targeted to preferentially etch the trench fill oxide material 18a, while etching the second nitride layer 20 and first nitride layer 14 at a significantly slower rate. FIG. 10 depicts the structure as it appears after the portions 18a of the trench fill oxide material layer 18 have been stripped away.

As depicted in FIG. 8, the first and second nitride layers 14 and 20 are preferably completely removed to expose the pad oxide layer 12 and the portions 18b of the trench fill oxide material 18 in the isolation trenches 16. As with the first embodiment described above, this is accomplished according to one or more of a number of different stripping methods. FIG. 8 depicts the structure as it appears after the first and second nitride layers 14 and 20 have been stripped.

In yet a third embodiment of the invention, the structure as depicted in FIG. 9 is processed in a densification step, where the structure is exposed to an oxygenated atmosphere at an elevated temperature. The continuous nitride layer 22, because it tends to provide a relatively efficient oxygen diffusion barrier, helps to reduce corner rounding of the shallow trench isolation oxide material 8b during the densification process. Processing after the densification step is accomplished as described above in the second general embodiment.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In a process for planarizing an isolation structure in a substrate, where the substrate has an upper surface, an improvement comprising:
   (a) depositing a pad protective material over the substrate upper surface, the pad protective material having a pad protective material upper surface at a level;
   (b) selectively removing portions of the pad protective material to expose portions of the substrate and to form sidewalls in the pad protective material;
   (c) forming a trench in the exposed portions of the substrate;
   (d) depositing a trench fill material in the trench and over the pad protective material upper surface; and
   (e) depositing a trench protective material over the trench fill material and in contact with the sidewalls of the pad protective material, whereby the pad protective material and portions of the trench protective material covering the trench together form a continuous and substantially coplanar protective material layer.

2. In a process for planarizing an isolation structure in a substrate, where the substrate has an upper surface, an improvement comprising:
   (a) depositing a pad protective material over the substrate upper surface, the pad protective material having a pad protective material upper surface at a level;
   (b) selectively removing portions of the pad protective material to expose portions of the substrate and to form sidewalls in the pad protective material;
   (c) forming a trench in the exposed portions of the substrate;
   (d) depositing a trench fill material in the trench and over the pad protective material upper surface;
   (e) selectively removing portions of the trench fill material to expose the sidewalls in the pad protective material, and
   (f) depositing a trench protective material over the trench fill material and in contact with the sidewalls of the pad protective material, whereby the pad protective material and portions of the trench protective material covering the trench together form a continuous protective material layer.

3. The process of claim 2 further comprising:
   (g) prior to step (a), depositing a pad oxide material over and adjacent the upper surface of the substrate; and
   step (a) further comprising depositing the pad protective material over and adjacent the pad oxide material.

4. The process of claim 2 further comprising, after step (c) and prior to step (d), forming a liner oxide material in the trench.

5. The process of claim 2 wherein:
   step (a) consists of depositing a first nitride layer over the substrate upper surface; and
   step (b) consists of selectively removing portions of the first nitride layer to expose portions of the substrate and to form sidewalls in the first nitride layer.

6. The process of claim 2 wherein step (b) consists of patterning and etching the pad protective material to expose portions of the substrate and to form sidewalls in the pad protective material.

7. The process of claim 2 wherein step (c) consists of etching the exposed portions of the substrate.

8. The process of claim 2 further comprising selectively removing portions of the trench fill material using an etchback process.

9. In a process for planarizing an isolation structure in a substrate, where the substrate has an upper surface, an improvement comprising:
   (a) depositing a pad protective material over the substrate upper surface, the pad protective material having a pad protective material upper surface at a level;
   (b) selectively removing portions of the pad protective material to expose portions of the substrate and to form sidewalls in the pad protective material;
   (c) forming a trench in the exposed portions of the substrate;
   (d) depositing a trench fill material in the trench and over the pad protective material upper surface;
   (e) depositing a trench protective material over the trench fill material and in contact with the sidewalls of the pad protective material, whereby the pad protective material and portions of the trench protective material covering the trench together form a continuous protective material layer;
   (f) selectively removing portions of the trench protective material and the trench fill material down to the level of the upper surface of the pad protective material; and
   (g) removing the pad protective material and any remaining trench protective material.

10. The process of claim 3 wherein:
    step (f) consists of chemical mechanical polishing of the trench protective material and the trench fill material down to the level of the upper surface of the pad protective material; and
    step (g) consists of stripping the pad protective material and any remaining trench protective material by etching.

11. In a process for planarizing an isolation structure in a substrate, where the substrate has an upper surface, an improvement comprising:
    (a) depositing a pad protective material over the substrate upper surface, the pad protective material having a pad protective material upper surface at a level;

(b) selectively removing portions of the pad protective material to expose portions of the substrate and to form sidewalls in the pad protective material;

(c) forming a trench in the exposed portions of the substrate;

(d) depositing a trench fill material in the trench and over the pad protective material upper surface;

(e) depositing a trench protective material over the trench fill material and in contact with the sidewalls of the pad protective material, whereby the pad protective material and portions of the trench protective material covering the trench together form a continuous protective material layer;

(f) selectively removing portions of the trench protective material to expose portions of the trench fill material that overly the pad protective material;

(g) selectively removing the exposed portions of the trench fill material that overlies the pad protective material down to the level of the upper surface of the pad protective material; and (h) removing the pad protective material and any remaining trench protective material.

12. The process of claim 11 wherein:

step (f) consists of chemical mechanical polishing the trench protective material to expose portions of the trench fill material overlying the pad protective material;

step (g) consists of subjecting the exposed portions of the trench fill material to an acid solution; and step (h) consists of stripping the pad protective material and any remaining trench protective material by etching.

13. In a process for planarizing an isolation structure in a substrate, where the substrate has an upper surface, an improvement comprising:

(a) depositing a first nitride layer over the substrate upper surface, the first nitride layer having a first nitride layer upper surface at a level;

(b) selectively removing portions of the first nitride layer to expose portions of the substrate and to form sidewalls in the first nitride layer;

(c) forming a trench in the exposed portions of the substrate;

(d) depositing a trench fill material in the trench and over the first nitride layer upper surface; and (e) depositing a second nitride layer over the trench fill material and in contact with the sidewalls of the first nitride layer, whereby the first nitride layer and portions of the second nitride layer covering the trench together form a continuous nitride layer.

14. In a process for planarizing an isolation sure in a substrate, where the substrate has an upper surface, an improvement comprising:

(a) depositing a pad protective material over the substrate upper surface, the pad protective material having a pad protective material upper surface at a level;

(b) selectively removing portions of the pad protective material to expose portions of the substrate and to form sidewalls in the pad protective material;

(c) forming a trench in the exposed portions of the substrate;

(d) depositing a trench fill oxide material using a high density plasma deposition process; and (e) depositing a trench protective material over the trench fill material and in contact with the sidewalls of the pad protective material, whereby the pad protective material and portions of the trench protective material covering the trench together form a continuous protective material layer.

15. In a process for planarizing an isolation structure in a substrate, where the substrate has an upper surface, an improvement comprising:

(a) depositing a pad protective material over the substrate upper surface, the pad protective material having a pad protective material upper surface at a level;

(b) selectively removing portions of the pad protective material to expose portions of the substrate and to form sidewalls in the pad protective material;

(c) forming a trench in the exposed portions of the substrate;

(d) depositing a trench fill material in the trench and over the pad protective material upper surface;

(e) depositing a trench protective material over the trench fill material and in contact with the sidewalls of the pad protective material, whereby the pad protective material and portions of the trench protective material covering the trench together form a continuous protective material layer;

(f) selectively removing portions of the trench protective material to expose portions of the trench fill material that overly the pad protective material;

(g) selectively removing the exposed portions of the trench fill material that overlie the pad protective material down to the level of the upper surface of the pad protective material; and (h) removing the pad protective material and any remaining trench protective material.

16. The process of claim 15 wherein:

step (a) consists of depositing a first nitride layer over the substrate upper surface; and step (b) consists of selectively removing portions of the first nitride layer to expose portions of the substrate and to form sidewalls in the first nitride layer.

17. The process of claim 15 wherein:

step (f) consists of chemical mechanical polishing the trench protective material to expose portions of the trench fill material overlying the pad protective material;

step (g) consists of subjecting the exposed portions of the trench fill material to an acid solution; and step (h) consists of stripping the pad protective material and any remaining trench protective material by etching.

18. A monolithic circuit manufactured according to the process of claim 15.

19. In a process for planarizing an isolation structure in a substrate, where the substrate has an upper surface, an improvement comprising:

(a) depositing a pad protective material over the substrate upper surface, the pad protective material having a pad protective material upper surface at a level;

(b) selectively removing portions of the pad protective material to expose portions of the substrate and to form sidewalls in the pad protective material;

(c) forming a trench in the exposed portions of the substrate;

(d) depositing a trench fill material in the trench and over the pad protective material upper surface;

(e) depositing a trench protective material over the trench fill material and in contact with the sidewalls of the pad protective material, whereby the pad protective material and portions of the trench protective material covering the trench together form a continuous protective material layer;

(f) selectively removing portions of the trench protective material and the trench fill material down to the level of the upper surface of the pad protective material; and (g) removing the pad protective material and any remaining trench protective material.

20. The process of claim 19 wherein:

step (f) consists of chemical mechanical polishing of the trench protective material and the trench fill material down to the level of the upper surface of the pad protective material; and step (g) consists of stripping the pad protective material and any remaining trench protective material by etching.

* * * * *